(12) United States Patent
Cheng et al.

(10) Patent No.: US 9,989,682 B2
(45) Date of Patent: Jun. 5, 2018

(54) MASK PLATE, METHOD FOR MANUFACTURING COLOR FILM SUBSTRATE AND COLOR FILM SUBSTRATE

(71) Applicants: BOE TECHNOLOGY GROUP CO., LTD., Beijing (CN); HEFEI BOE OPTOELECTRONICS TECHNOLOGY CO., LTD., Hefei, Anhui Province (CN)

(72) Inventors: Xuepei Cheng, Beijing (CN); Dongdong Yin, Beijing (CN); Xuequan Yu, Beijing (CN); Zhiqiang Li, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui Province (CN)

( * ) Notice: Subject to any disclaimer, the term of this patent is extended or adjusted under 35 U.S.C. 154(b) by 0 days. days.

(21) Appl. No.: 14/742,608

(22) Filed: Jun. 17, 2015

(65) Prior Publication Data

US 2016/0266287 A1 Sep. 15, 2016

(30) Foreign Application Priority Data

Mar. 9, 2015 (CN) .......................... 2015 1 0103229

(51) Int. Cl.
*G02B 5/22* (2006.01)
*G02B 5/20* (2006.01)
(Continued)

(52) U.S. Cl.
CPC ....... *G02B 5/201* (2013.01); *G02F 1/133512* (2013.01); *G02F 1/133516* (2013.01); *G03F 7/0007* (2013.01)

(58) Field of Classification Search
CPC .......... G02B 5/201; G02B 5/22; G02B 5/223; G02B 5/003; G02B 5/20; G02F 1/133514;
(Continued)

(56) References Cited

U.S. PATENT DOCUMENTS 8,351,143 B2 * 1/2013 Zhou ...................... G02B 5/201
359/891
2002/0167635 A1 11/2002 Yi
(Continued)

FOREIGN PATENT DOCUMENTS

| CN | 101435993 | 5/2009 |
|---|---|---|
| CN | 101861533 | 10/2010 |

(Continued)

OTHER PUBLICATIONS

"Spacer," Merriam-Webster, <https://www.merriam-webster.com/dictionary/spacer>, Dec. 8, 2017.*
(Continued)

*Primary Examiner* — Jade R Chwasz
(74) *Attorney, Agent, or Firm* — Womble Bond Dickinson (US) LLP

(57) ABSTRACT

A mask plate, a method for manufacturing a color film substrate and a color film substrate for decreasing the segment difference of the color filter layer are disclosed. The mask plate includes a plurality of first regions, each of the plurality of first regions corresponding to each subpixel unit; and a second region between two adjacent first regions. Each first region is respectively provided with one first subregion for forming a color filter layer pattern within an opening region of a black matrix layer, and two second subregions for forming a color filter layer pattern within a non-opening region of the black matrix layer. The first subregion is between the two second subregions. In each second subre-
(Continued)

gion: along the direction away from the first subregion, the transmittance of the second subregion gradually decreases or increases.

5 Claims, 3 Drawing Sheets

(51) Int. Cl.
*G02F 1/1335* (2006.01)
*G03F 7/00* (2006.01)

(58) Field of Classification Search
CPC ......... G02F 1/133512; G02F 1/133516; G02F 1/13394; G02F 1/134309; G02F 2001/13396; G03F 7/0007; G03F 7/20; G03F 7/16; G03F 7/32; G03F 1/50
USPC .................................. 359/885, 888, 891, 892
See application file for complete search history.

(56) References Cited

U.S. PATENT DOCUMENTS

| 2006/0072064 A1* | 4/2006 | Kim ................. G02F 1/133707 349/187 |
| 2009/0130486 A1 | 5/2009 | Zhou et al. |
| 2010/0302482 A1* | 12/2010 | Takahashi .............. G02B 5/201 349/106 |

FOREIGN PATENT DOCUMENTS

| CN | 102707564 | 10/2012 |
| CN | 104330926 | 2/2015 |

OTHER PUBLICATIONS

"First office action," CN Application No. 201510103229.2 (dated Feb. 26, 2018).

* cited by examiner

MASK PLATE, METHOD FOR MANUFACTURING COLOR FILM SUBSTRATE AND COLOR FILM SUBSTRATE

RELATED APPLICATIONS

The present application claims the benefit of Chinese Patent Application No. 201510103229.2, filed Mar. 9, 2015, the entire disclosure of which is incorporated herein by reference.

FIELD OF THE INVENTION

The present invention relates to the technical field of display, in particular to a mask plate, a method for manufacturing a color film substrate and a color film substrate.

BACKGROUND OF THE INVENTION

An existing TFT-LCD CF (color filter) process is shown in FIG. 1 and FIG. 2. Wherein FIG. 1 is a structural schematic diagram of a color film substrate in the prior art; FIG. 2 is a structural schematic diagram of a mask plate in the prior art. The mask plate in the prior art generally comprises: a first region 07 one-to-one corresponding to each subpixel unit, and a second region 08 between two adjacent first regions 07. The photoresist used for the color filter layer is generally negative photoresist; therefore the first region 07 of the mask plate is fully transparent, the second region 08 is fully opaque; the formed pattern of the color filter layer is shown in FIG. 1. A color film substrate in the prior art mainly comprises: a glass substrate 01, a black matrix layer 02, a color filter layer 03, a planarization layer 04, a spacer 05, and a transparent electrode layer 06. In order to prevent the occurrence of light leakage, the color filter layer 03 should overlap with a part of the black matrix layer 02; in order to avoid an influence on the image quality due to the segment difference of the overlapping part, the planarization layer 04 is required; this will add a process, increasing the cost of production; moreover, the planarization layer 04 will reduce the transmittance of the color film substrate, resulting in the decrease of contrast.

SUMMARY OF THE INVENTION

The embodiments of the present invention provide a mask plate, a method for manufacturing a color film substrate and a color film substrate for decreasing the segment difference of the color filter layer, improving the transmittance of the color film substrate, thereby improving the display effect of the display substrate.

To this end, the embodiments of the present invention provide the following solutions.

An embodiment of the present invention provides a mask plate, wherein the mask plate comprises:

a plurality of first regions, each of the plurality of first regions corresponds to each subpixel unit; and a second region between two adjacent first regions; wherein each first region is respectively provided with one first subregion for forming a color filter layer pattern within a opening region of a black matrix layer, and two second subregions for forming a color filter layer pattern within a non-opening region of the black matrix layer; the first subregion is between the two second subregions; and in each second subregion:

along the direction away from the first subregion, the transmittance of the second subregion gradually decreases or increases.

The mask plate provided by the embodiment of the present invention applies a structure, in which different regions corresponds to different transmittance; when a color filter layer is manufactured with the mask plate provided by the embodiment of the present invention, parts of the color filter layer corresponding to the first subregion, the second subregion and the second region have different heights after exposure and developing, reducing the segment difference between the different parts of the color filter layer; in such a way, the height difference between a surface of the color filter layer formed on the black matrix layer departing from the black matrix layer and a surface of the color filter layer formed within the opening region of the black matrix layer departing from the black matrix layer is greater than or equal to 0 micrometer and less than 0.5 micrometer; in this manner, a step of preparing a planarization layer can be omitted, improving the production efficiency.

In some optional embodiments, if each first subregion is a fully transparent region, each second subregion is a light shielding region, in each second subregion within a first region: along the direction away from the first subregion, the transmittance of the second subregion gradually decreases. In such a way, the height difference between a surface of the color filter layer formed on the black matrix layer departing from the black matrix layer and a surface of the color filter layer formed within the opening region of the black matrix layer departing from the black matrix layer is greater than or equal to 0 micrometer and less than 0.5 micrometer.

In some optional embodiments, if each first subregion is a light shielding region, each second subregion is a fully transparent region, in each second subregion within a first region: along the direction away from the first subregion, the transmittance of the second subregion gradually increases. In such a way, the height difference between a surface of the color filter layer formed on the black matrix layer departing from the black matrix layer and a surface of the color filter layer formed within the opening region of the black matrix layer departing from the black matrix layer is greater than or equal to 0 micrometer and less than 0.5 micrometer.

In some optional embodiments, the transmittance of the second subregion is 49%~73%. In this manner, it is further ensured that the height difference between a surface of the color filter layer formed on the black matrix layer departing from the black matrix layer and a surface of the color filter layer formed within the opening region of the black matrix layer departing from the black matrix layer is greater than or equal to 0 micrometer and less than 0.5 micrometer.

An embodiment of the present invention further provides a method for manufacturing a color film substrate with the mask plate mentioned above, wherein the method comprises:

coating color photoresist on a substrate formed with a black matrix layer; performing an alignment process on the mask plate and the substrate, wherein each first subregion of the mask plate faces a opening region of the black matrix layer;

performing a exposure and developing process on the coated color photoresist based on the aligned mask plate, forming a color filter layer located on the black matrix layer and located within the opening region of the black matrix layer; the height difference in a surface of the color filter layer departing from the black matrix layer being greater than or equal to 0 micrometer and less than 0.5 micrometer; and forming spacers on the surface of the color filter layer departing from the black matrix.

A color film substrate can be manufactured with the manufacturing method provided by the embodiment of the present invention; in such a way, a step of preparing a planarization layer can be omitted, simplifying the technological process; meanwhile, the influence of the planarization layer on the transmittance of the color filter layer can be eliminated, improving the transmittance of the color film substrate.

In some optional embodiments, the color photoresist is a positive photoresist, each first subregion of the mask plate is a light shielding region, each second subregion is a fully transparent region, in each second subregion within a first region: along the direction away from the first subregion, the transmittance of the second subregion gradually increases.

In some optional embodiments, the color photoresist is a negative photoresist, each first subregion of the mask plate is a fully transparent region, each second subregion is a light shielding region, in each second subregion within a first region: along the direction away from the first subregion, the transmittance of the second subregion gradually decreases.

An embodiment of the present invention further provides a color film substrate, wherein the color film substrate comprises: a basal substrate, a black matrix layer on the basal substrate; wherein the color film substrate further comprises:

a color filter layer on the black matrix layer; the height difference in a surface of the color filter layer departing from the black matrix layer being greater than or equal to 0 micrometer and less than 0.5 micrometer; and spacers on the color filter layer.

Since a planarization layer is not required for the color film substrate provided by the embodiment of the present invention, the color film substrate provided by the embodiment of the present invention has a good transmittance.

In some optional embodiments, the color filter layer is formed with a positive photoresist material or a negative photoresist material.

In some optional embodiments, a part of the color filter layer corresponding to the subpixel unit has a structure of "Y" shape.

REFERENCE SIGNS

01—glass substrate
02—black matrix layer
03—color filter layer
04—planarization layer
05—spacer
06—transparent electrode layer
07—first region
08—second region
11—first region
111—first subregion
112—second subregions
12—second region
2—basal substrate
3—black matrix layer
4—color filter layer
5—spacer
6—transparent electrode layer.

DETAILED DESCRIPTION OF THE INVENTION

In the following, the technical solutions in embodiments of the invention will be described clearly and completely in connection with the drawings in the embodiments of the invention. Obviously, the described embodiments are only part of the embodiments of the invention, and not all of the embodiments. Based on the embodiments in the invention, all other embodiments obtained by those of ordinary skills in the art under the premise of not paying out creative work pertain to the protection scope of the invention.

Figure 1:
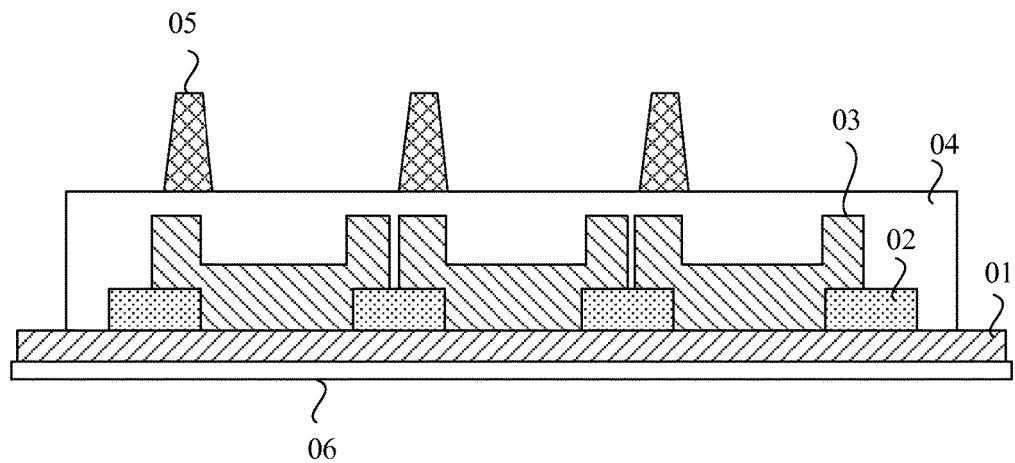
FIG. 1 is a structural schematic diagram of a color film substrate in the prior art.
Figure 2:
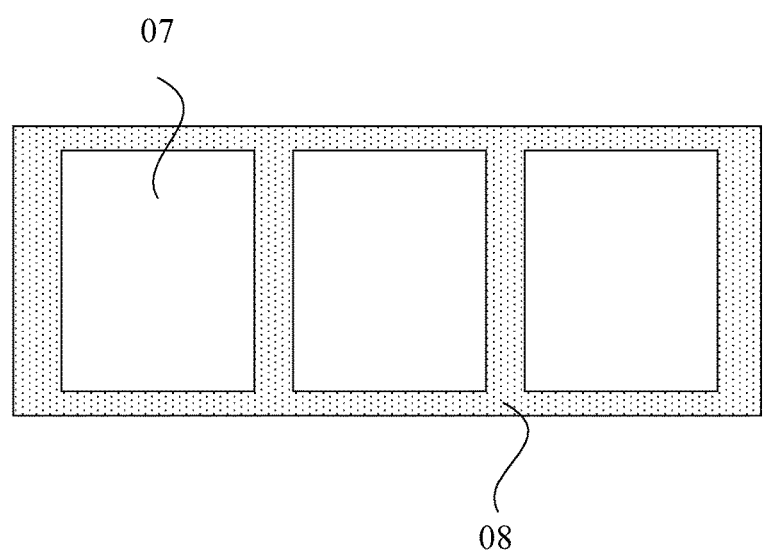
FIG. 2 is a structural schematic diagram of a mask plate in the prior art.
Figure 3:
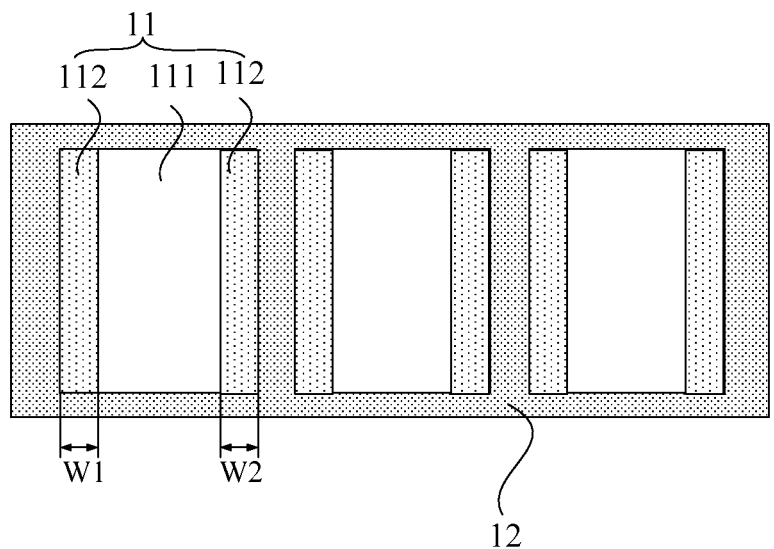
FIG. 3 is a structural schematic diagram of a mask plate provided by an embodiment of the present invention.
Figure 4:
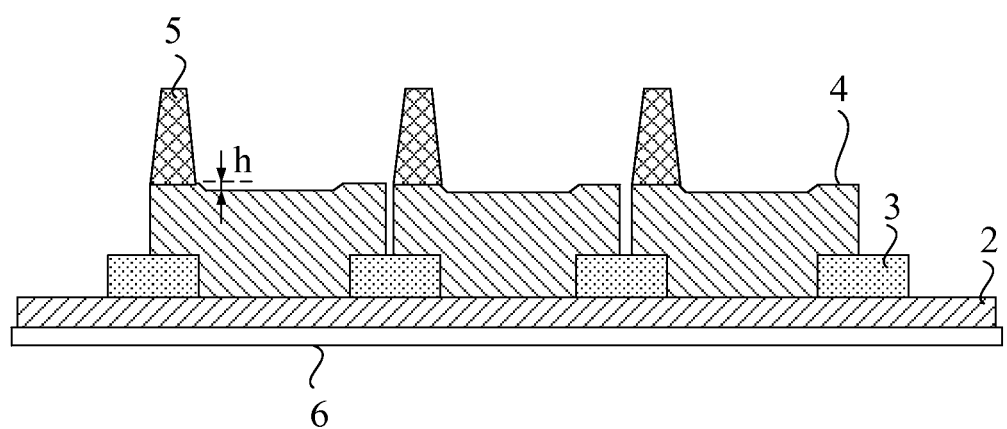
FIG. 4 is a structural schematic diagram of a color film substrate provided by an embodiment of the present invention.

As shown in FIG. 3 and FIG. 4, wherein FIG. 3 is a structural schematic diagram of a mask plate provided by an embodiment of the present invention; FIG. 4 is a structural schematic diagram of a color film substrate provided by an embodiment of the present invention. An embodiment of the present invention provides a mask plate, wherein the mask plate comprises: a plurality of first regions 11, each of the plurality of first regions 11 corresponds to each subpixel unit; and a second region 12 between two adjacent first regions 11; wherein each first region 11 is respectively provided with one first subregion 111 for forming a color filter layer pattern within a opening region of a black matrix layer 3, and two second subregions 112 for forming a color filter layer pattern within a non-opening region of the black matrix layer 3; the first subregion 111 is between the two second subregions 112; and in each second subregion 112:

along the direction away from the first subregion 111, the transmittance of the second subregion 112 gradually decreases or increases.

The mask plate provided by the embodiment of the present invention applies a structure, in which different regions corresponds to different transmittance; when a color filter layer is manufactured with the mask plate provided by the embodiment of the present invention, parts of the color filter layer 4 corresponding to the first subregion 111, the second subregion 112 and the second region 12 have different heights after exposure and developing, reducing the segment difference between the different parts of the color filter layer; in such a way, the height difference h between a surface of the color filter layer 4 formed on the black matrix layer 3 departing from the black matrix layer 3 and a surface of the color filter layer 4 formed within the opening region of the black matrix layer 3 departing from the black matrix layer 3 is greater than or equal to 0 micrometer and less than 0.5 micrometer; in this manner, a step of preparing a planarization layer can be omitted, improving the production efficiency.

Along the direction away from the first subregion, the transmittance of the second subregion gradually decreases or increases along a preset length; the preset length is a width of the overlapping part of the color filter layer and the black matrix layer along the direction away from the first subregion; those skilled in the art can set the preset length by experience. The preset length can be zero or other values;

when the preset length is not equal to zero, the transmittance gradually decreases or increases along the direction away from the first subregion.

Since the photoresist used in the exposure and developing of the mask plate can either be a positive photoresist or a negative photoresist, the transmittance corresponding to respective regions of the mask plate will be different.

In an embodiment, the color photoresist is a negative photoresist, each first subregion 111 of the mask plate is a fully transparent region, each second subregion 12 is a light shielding region, in each second subregion within a first region 11: along the direction away from the first subregion 111, the transmittance of the second subregion 112 gradually decreases. In this case, all the photoresist corresponding to the first subregion 111 of the mask plate will be kept, and a part of the photoresist corresponding to the second subregion 112 will be removed by developing; in such a way, the segment difference between the different parts of the color filter layer can be reduced, i.e., the height of the color filter layer 4 on the black matrix layer 3 is less than the height of the color filter layer 4 within the opening region of the black matrix layer 3. In this manner, the height difference h between a surface of the color filter layer 4 formed on the black matrix layer 3 departing from the black matrix layer 3 and a surface of the color filter layer 4 formed within the opening region of the black matrix layer 3 departing from the black matrix layer 3 is greater than or equal to 0 micrometer and less than 0.5 micrometer. When the exposure accuracy of the exposure machine is 0, it can be ensured that the height of the surface of the color filter layer 4 formed on the black matrix layer 3 departing from the black matrix layer 3 is same with the height of the surface of the color filter layer 4 formed within the opening region of the black matrix layer 3 departing from the black matrix layer 3.

In another embodiment, the color photoresist is a positive photoresist, each first subregion 111 of the mask plate is a light shielding region, each second subregion 12 is a fully transparent region, in each second subregion within a first region 11: along the direction away from the first subregion 111, the transmittance of the second subregion 112 gradually increases. In this case, all the photoresist corresponding to the first subregion 111 of the mask plate will be kept, and a part of the photoresist corresponding to the second subregion 112 will be removed by developing; in such a way, the segment difference between the different parts of the color filter layer can be reduced, i.e., the height of the color filter layer 4 on the black matrix layer 3 is less than the height of the color filter layer 4 within the opening region of the black matrix layer 3. In this manner, the height difference h between a surface of the color filter layer 4 formed on the black matrix layer 3 departing from the black matrix layer 3 and a surface of the color filter layer 4 formed within the opening region of the black matrix layer 3 departing from the black matrix layer 3 is greater than or equal to 0 micrometer and less than 0.5 micrometer. When the exposure accuracy of the exposure machine is 0, it can be ensured that the height of the surface of the color filter layer 4 formed on the black matrix layer 3 departing from the black matrix layer 3 is same with the height of the surface of the color filter layer 4 formed within the opening region of the black matrix layer 3 departing from the black matrix layer 3.

On the basis of color film substrate specification requirements, the widths W1 and W2 of the two second aubregions within each first region can be same or different.

The thickness of a color filter layer is typically about 2.25 μm, and the thickness of a black matrix layer is typically about 1.05 μm; therefore, preferably, the transmittance of the second subregion is 49%~73%, e.g. 49%, 51%, 54%, 57%, 60%, 65%, 70%, 71%, or 73%, which will not be illustrated one by one herein. Such a transmittance can ensure that the height of the color filter layer formed on the black matrix layer is between 1.1 μm~1.65 μm; it is further ensured that the height difference h between a surface of the color filter layer 4 formed on the black matrix layer 3 departing from the black matrix layer 3 and a surface of the color filter layer 4 formed within the opening region of the black matrix layer 3 departing from the black matrix layer 3 is greater than or equal to 0 micrometer and less than 0.5 micrometer.

When the photoresist used in the exposure and developing is a negative photoresist: if the transmittance of the second subregion is less than 49%, the height of the color filter layer 4 on the black matrix layer 3 will be less than 1.1 μm, then the height of the surface of the color filter layer 4 formed on the black matrix layer 3 departing from the black matrix layer 3 will be less than the height of the surface of the color filter layer 4 formed within the opening region of the black matrix layer 3 departing from the black matrix layer 3, i.e., the flatness of the color filter layer 4 will be improved; while if the transmittance of the second subregion is greater than 73%, the height of the color filter layer 4 on the black matrix layer 3 will be greater than 1.65 μm, then the height of the surface of the color filter layer 4 formed on the black matrix layer 3 departing from the black matrix layer 3 will be far greater than the height of the surface of the color filter layer 4 formed within the opening region of the black matrix layer 3 departing from the black matrix layer 3, i.e., the flatness of the color filter layer 4 will be reduced.

When the photoresist used in the exposure and developing is a positive photoresist: if the transmittance of the second subregion is less than 49%, the height of the color filter layer 4 on the black matrix layer 3 will be greater than 1.65 μm, then the height of the surface of the color filter layer 4 formed on the black matrix layer 3 departing from the black matrix layer 3 will be greater than the height of the surface of the color filter layer 4 formed within the opening region of the black matrix layer 3 departing from the black matrix layer 3, i.e., the flatness of the color filter layer 4 will be reduced; while if the transmittance of the second subregion is greater than 73%, the height of the color filter layer 4 on the black matrix layer 3 will be less than 1.1 μm, then the height of the surface of the color filter layer 4 formed on the black matrix layer 3 departing from the black matrix layer 3 will be less than the height of the surface of the color filter layer 4 formed within the opening region of the black matrix layer 3 departing from the black matrix layer 3, i.e., the flatness of the color filter layer 4 will be improved.

Figure 5:
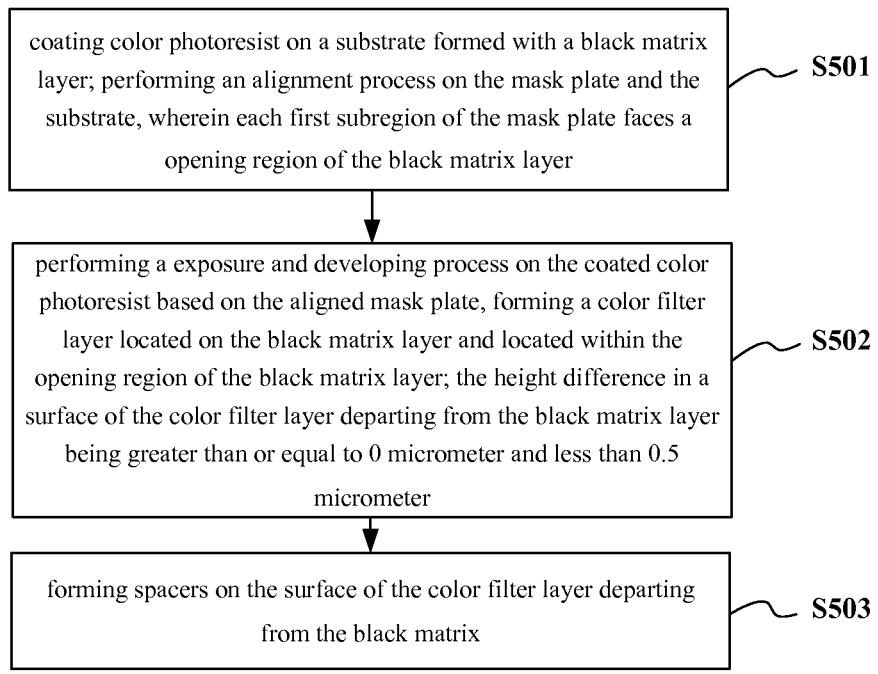
FIG. 5 is a flow chart of a method for manufacturing a color film substrate provided by an embodiment of the present invention.

FIG. 5 is a flow chart of a method for manufacturing a color film substrate provided by an embodiment of the present invention. The method for manufacturing a color film substrate provided by an embodiment of the present invention comprises:

Step S501: coating color photoresist on a substrate formed with a black matrix layer; performing an alignment process on the mask plate and the substrate, wherein each first subregion of the mask plate faces a opening region of the black matrix layer;

Step S502: performing a exposure and developing process on the coated color photoresist based on the aligned mask plate, forming a color filter layer located on the black matrix layer and located within the opening region of the black matrix layer; the height difference in a surface of the color filter layer departing from the black matrix layer being greater than or equal to 0 micrometer and less than 0.5 micrometer; and Step S503: forming spacers on the surface of the color filter layer departing from the black matrix.

A color film substrate can be manufactured with the manufacturing method provided by the embodiment of the present invention; in such a way, a step of preparing a planarization layer can be omitted, simplifying the technological process; meanwhile, the influence of the planarization layer on the transmittance of the color filter layer can be eliminated, improving the transmittance of the color film substrate.

Certainly, the above mentioned color filter layer can also be composed of a color resin layer. In such a situation, the method for manufacturing a color filter layer comprises: coating color resin layer on a substrate formed with a black matrix layer, coating photoresist on the color resin layer; performing an alignment process on the mask plate and the substrate, wherein each first subregion of the mask plate faces a opening region of the black matrix layer; performing a exposure, developing and etching process on the coated photoresist based on the aligned mask plate, forming a color filter layer located on the black matrix layer and located within the opening region of the black matrix layer; the height difference in a surface of the color filter layer departing from the black matrix layer being greater than or equal to 0 micrometer and less than 0.5 micrometer; and forming spacers on the surface of the color filter layer departing from the black matrix.

If the color photoresist is a negative photoresist, each first subregion of the mask plate is a fully transparent region, each second subregion is a light shielding region, in each second subregion within a first region: along the direction away from the first subregion, the transmittance of the second subregion gradually decreases.

If the color photoresist is a positive photoresist, each first subregion of the mask plate is a light shielding region, each second subregion is a fully transparent region, in each second subregion within a first region: along the direction away from the first subregion, the transmittance of the second subregion gradually increases.

As shown in FIG. 4, an embodiment of the present invention further provides a color film substrate, wherein the color film substrate comprises: a basal substrate 2, a black matrix layer 3 on the basal substrate 2; wherein the color film substrate further comprises:

a color filter layer 4 on the black matrix layer 3; the height difference in a surface of the color filter layer 4 departing from the black matrix layer 3 being greater than or equal to 0 micrometer and less than 0.5 micrometer; and spacers 5 on the color filter layer 4.

Certainly, the color film substrate can also comprise a transparent electrode layer 6, which is located on a surface of the basal substrate 2 departing from the black matrix layer.

Since in the color filter layer provided by the embodiment of the present invention, the height difference in a surface of the color filter layer departing from the black matrix layer is greater than or equal to 0 micrometer and less than 0.5 micrometer, a planarization layer is not required; therefore, the color film substrate provided by the embodiment of the present invention has a good transmittance.

Optionally, the color filter layer is formed with a positive photoresist material or a negative photoresist material.

The specific structure of the part of the color filter layer corresponding to the subpixel unit can be various. Optionally, as shown in FIG. 4, the part of the color filter layer corresponding to the subpixel unit has a structure of "Y" shape.

Apparently, the person skilled in the art may make various alterations and variations to the invention without departing the spirit and scope of the invention. As such, provided that these modifications and variations of the invention pertain to the scope of the claims of the invention and their equivalents, the invention is intended to embrace these alterations and variations.

The invention claimed is:

1. A method for manufacturing a color film substrate with a mask plate comprising: a plurality of first regions, each of the plurality of first regions corresponding to each subpixel unit; and a second region between two adjacent first regions; wherein each first region is respectively provided with one first subregion for forming a color filter layer pattern within a opening region of a black matrix layer, and two second subregions for forming a color filter layer pattern within a non-opening region of the black matrix layer; wherein the first subregion is between the two second subregions;

wherein in each second subregion, along the direction away from the first subregion, the transmittance of the second subregion decreases monotonically; alternatively, in each second subregion, along the direction away from the first subregion, the transmittance of the second subregion increases monotonically;

wherein the method comprises:

coating color photoresist on a substrate formed with a black matrix layer; performing an alignment process on the mask plate and the substrate, wherein each first subregion of the mask plate faces an opening region of the black matrix layer;

performing a exposure and developing process on the coated color photoresist based on the aligned mask plate, forming a color filter layer located on the black matrix layer and located within the opening region of the black matrix layer, a height difference between a part of the color filter layer corresponding to the first subregion and a part of the color filter layer corresponding to the second subregion being greater than or equal to 0 micrometer and less than 0.5 micrometer; and forming a spacer directly on a surface of the color filter layer departing from the black matrix without forming a planarization layer;

wherein the spacer is located on an end of the color filter layer, and a top of the spacer is higher than a top of the color filter layer.

2. The method for manufacturing a color film substrate according to claim 1, wherein the color photoresist is a positive photoresist; each first subregion of the mask plate is a light shielding region; each second subregion is a fully transparent region; in each second subregion within a first region: along the direction away from the first subregion, the transmittance of the second subregion increases monotonically.

3. The method for manufacturing a color film substrate according to claim 1, wherein the color photoresist is a negative photoresist; each first subregion of the mask plate is a fully transparent region; each second subregion is a light shielding region; in each second subregion within a first region: along the direction away from the first subregion, the transmittance of the second subregion decreases monotonically.

4. A color film substrate manufactured with a mask plate comprising: a plurality of first regions, each of the plurality of first regions corresponding to each subpixel unit; and a second region between two adjacent first regions; wherein each first region is respectively provided with one first subregion for forming a color filter layer pattern within an opening region of a black matrix layer, and two second subregions for forming a color filter layer pattern within a non-opening region of the black matrix layer; wherein the first subregion is between the two second subregions;

wherein in each second subregion, along the direction away from the first subregion, the transmittance of the second subregion decreases monotonically; alternatively, in each second subregion, along the direction away from the first subregion, the transmittance of the second subregion increases monotonically;

wherein the color film substrate comprises: a basal substrate, a black matrix layer on the basal substrate; wherein the color film substrate further comprises:

a color filter layer on the black matrix layer, a height difference between a part of the color filter layer corresponding to the first subregion and a part of the color filter layer corresponding to the second subregion being greater than or equal to 0 micrometer and less than 0.5 micrometer; and a spacer directly formed on a surface of the color filter layer departing from the black matrix without a planarization layer; wherein the spacer is located on an end of the color filter layer, and a top of the spacer is higher than a top of the color filter layer.

5. The color film substrate according to claim 4, wherein the color filter layer is formed with a positive photoresist material or a negative photoresist material.

* * * * *